United States Patent [19]

Washburn

[11] Patent Number: 4,514,827
[45] Date of Patent: Apr. 30, 1985

[54] METHOD FOR SELECTING PROPAGATION ELEMENTS FOR MAGNETIC BUBBLE MEMORY

[75] Inventor: Hudson A. Washburn, Santa Clara, Calif.

[73] Assignee: Intel Corporation, Santa Clara, Calif.

[21] Appl. No.: 483,914

[22] Filed: Apr. 11, 1983

[51] Int. Cl.³ .............................................. G11C 19/08
[52] U.S. Cl. .......................................... 365/1; 365/43
[58] Field of Search ............... 365/1, 36, 43; 324/208, 324/210

[56] References Cited

U.S. PATENT DOCUMENTS 4,247,912  1/1981  Cullum, Jr. ............................ 365/36

FOREIGN PATENT DOCUMENTS 56-32713  7/1981  Japan .................................... 365/36

Primary Examiner—James W. Moffitt
Attorney, Agent, or Firm—Blakely, Sokoloff, Taylor & Zafman

[57] ABSTRACT

A method for selecting permalloy propagation elements for a magnetic bubble memory is described. The invented method recognizes that propagation characteristics are not symmetrical for a given propagation element. Different propagation elements are fabricated and their propagation characteristics are determined in different directions. Then propagation elements are selected so as to optimize propagation for each direction.

9 Claims, 6 Drawing Figures

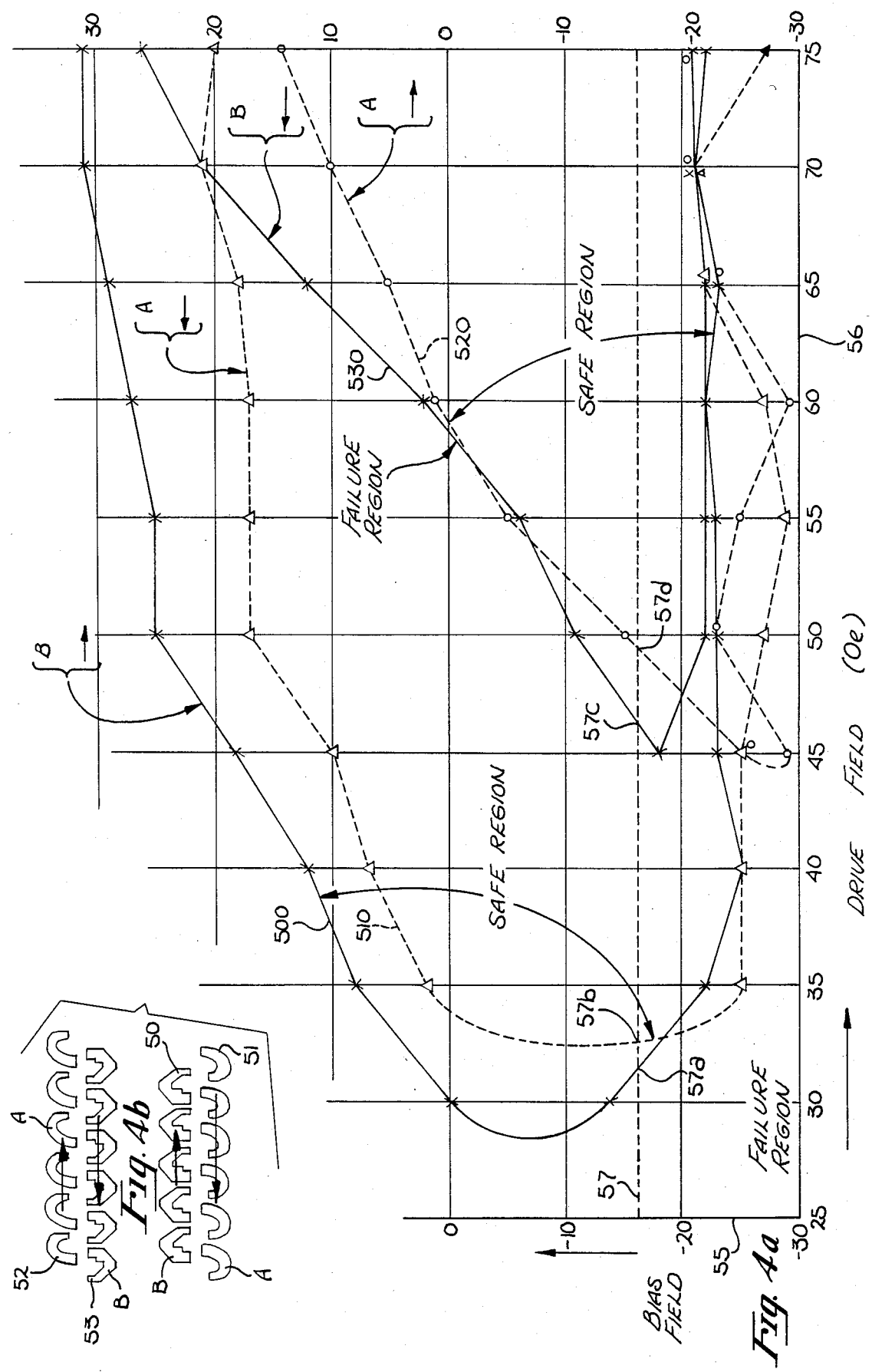

METHOD FOR SELECTING PROPAGATION ELEMENTS FOR MAGNETIC BUBBLE MEMORY

BACKGROUND OF THE INVENTION

1. Field of the Invention

The invention relates to the field of magnetic bubble memories, particularly those employing permalloy propagation elements.

2. Prior Art

Magnetic bubble memories employing a magnetic garnet layer in which magnetic bubbles are propagated and overlying permalloy propagation elements are well-known. Typically, the bubbles are propagated in parallel lines (in both directions) under the influence of a rotating magnetic field. At the ends of these lines, larger propagation elements are used to urge the bubbles from one line to another.

Much effort has occurred in optimizing the shape of these propagation elements. Dozens of different chevron-shaped elements are used or proposed for providing more efficient bubble propagation. See for instance, "Characteristics and Test Results for 272k Bubble Memory Package", *IEEE Transactions on Magnetics*, Vol. MAG-13, No. 5, September 1977 by Boebeck and Danylchuk; and "68k Bit Capacity 16 μm-Period Magnetic Bubble Memory Chip Design with 2 μm Minimum Features", *IEEE Transactions on Magnetics*, Vol. MAG-12, No. 6, November 1976 by Bonyhard and Smith. Also see U.S. Pat. Nos. 3,940,631; 3,940,751; 4,117,544; 4,151,601 and 4,276,613.

In general, a particular propagation element is selected for a magnetic bubble memory and this propagation element is used throughout the memory. The propagation elements are selected to provide optimum bubble transfer, generally with an eye to reducing the magnitude of the rotating magnetic field. Reduction in the strength of this field reduces power dissipation.

It apparently has been assumed that the propagation characteristics for a given permalloy propagation element are the same, or approximately the same in any direction. That is, the characteristics for a given chevron element are the same when the bubble is transferred in a first direction or in a second direction opposite to the first direction. As will be seen, the present invention departs from this assumption, accepts the asymmetry apparently inherent in the fabrication of magnetic bubble memories and provides a method for selecting propagation elements based on the asymmetry.

SUMMARY OF THE INVENTION

A method is described for selecting propagation elements for a magnetic bubble memory which generally includes an epitaxial layer in which magnetic bubbles are propagated and permalloy propagation elements for propagating the bubbles. The method recognizes that propagation characteristics are not symmetrical. Lines of different propagation elements are formed. Bubbles are then propagated in the epitaxial layer in two directions to determine the propagation characteristics of the different elements. Then one element is selected for propagating bubbles in one direction and the other element for propagation in the other direction. The selection is done to optimize bubble propagation in the epitaxial layer (e.g., to reduce power consumption by reducing the drive field).

BRIEF DESCRIPTION OF THE DRAWINGS

FIG. 4a is a graph illustrating propagation characteristics prepared in practicing the invented method.

FIG. 4b are plan views of propagation elements used in conjunction with the graph of FIG. 4a.

DETAILED DESCRIPTION OF THE INVENTION

A method for selecting propagation elements for a magnetic bubble memory is described. In the following description, numerous specific details are set forth including specific chevron elements and specific test data to provide a thorough understanding of the present invention. It will be obvious, however, to one skilled in the art that the present invention may be practiced without these specific details. In other instances, well-known methods, processes and structures have not been shown or discussed in detail in order not to unnecessarily obscure the present invention.

The method of the present invention is highly process sensitive. That is, the selection of propagation elements to optimize bubble propagation will vary from process-to-process. Consequently, for a particular process for fabricating bubble memories, the method of the present invention is employed to select propagation elements suited for that process, and that selection will most probably not be useful for another process.

The method is currently practiced for a memory which is fabricated on a garnet substrate, specifically a gadolinum gallium garnet (Gd3Ga5O12). An ion implanted magnetic garnet (epitaxial layer) is used on the substrate for the magnetic storage layer. The bubbles are moved in this layer in a well-known manner by an in-plane rotating magnetic field. A fixed magnetic field perpendicular to the rotating magnetic field (or slightly skewed to this perpendicular) is used as is well-known. Aluminum alloy contacts and conductors are fabricated on a silicon dioxide layer, or other suitable spacer layer, which is formed over the storage layer. Permalloy patterns (including the propagation elements) are formed from a material having a soft magnetic property on a second silicon dioxide layer, or other suitable spacer layer, which covers the conductors.

Figure 1:
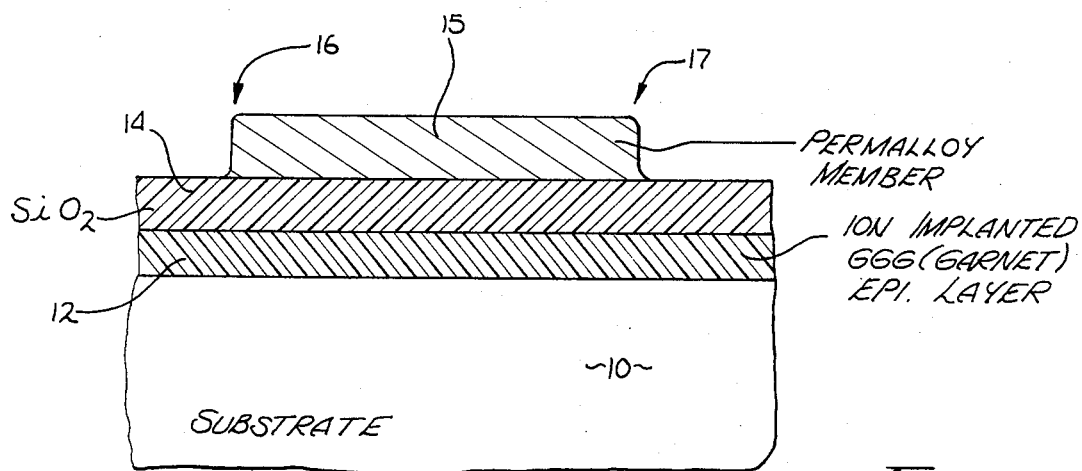
FIG. 1 is a partial cross-sectional elevation view of a garnet substrate which includes an epitaxial layer and an overlying permalloy member.

Referring to FIG. 1, a garnet substrate 10 is illustrated with an overlying epitaxial layer 12 fabricated on the substrate. In the presently preferred embodiment, this layer is an ion implanted magnetic garnet in which the bubbles are stored. Above layer 12 is a silicon dioxide layer 14, and above this layer the permalloy members including the propagation elements are fabricated. A single propagation element 15 is illustrated in FIG. 1. As mentioned above, the propagation elements, such as chevron elements used in a typical magnetic memory, have the same shape throughout the entire memory. It is generally accepted that the propagation characteristics are the same in any direction in the magnetic layer.

Through testing it has been determined that there is an asymmetry in the propagation characteristics of propagation elements with respect to direction. Thus, a line of particular propagation elements will be more effective in transferring bubbles in one direction than in the opposite direction. The reason for this is not known with certainty, although it is believed that asymmetry based on crystal orientation occurs during the growth of the epitaxial layer and during the ion implantation of this layer. This asymmetry interacts with stresses from the overlying permalloy members such as member 15 of FIG. 1. For instance, the magnetostrictive effect due to stress from corner 16 is different from that from corner 17. This difference in stress effects the propagation characteristics of the elements.

Figure 3:
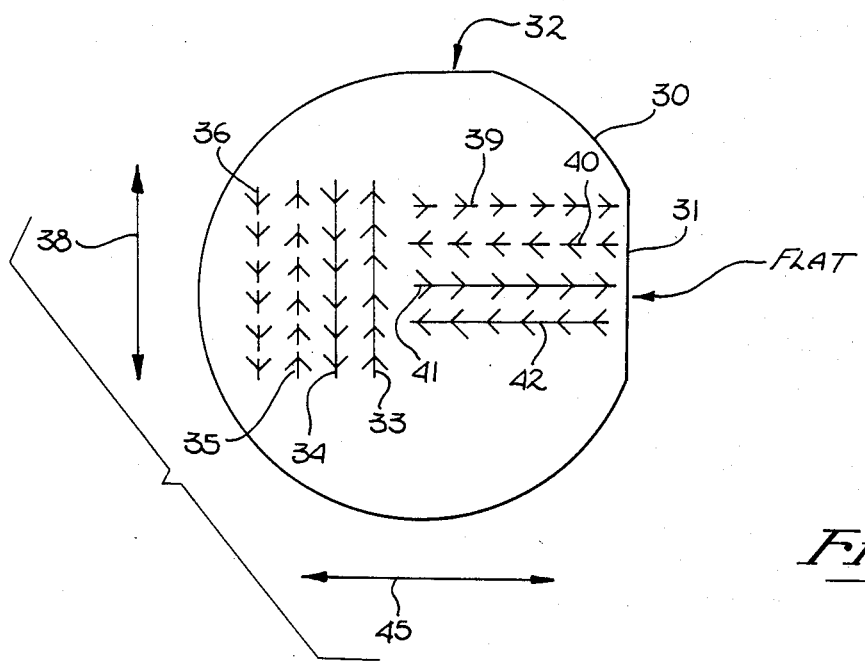
FIG. 3 is a plan view of a wafer upon which different propagation elements are fabricated in accordance with the invented method.

The propagation characteristics are consequently dependent on the crystal orientation within the substrate. As shown in FIG. 3, a typical garnet wafer 30 includes a flat region (sector) 31 which gives a consistent indication of the crystal orientation within the wafer. Some wafers include additional, smaller flat regions such as region 32. (In the presently preferred embodiment, the wafer has a crystal orientation of 111.)

When the propagation characteristics of different elements are determined, they are determined, for instance, with respect to the flat 31. This flat may be used as a reference for orienting the finally selected propagation elements during production processing.

Figure 2:
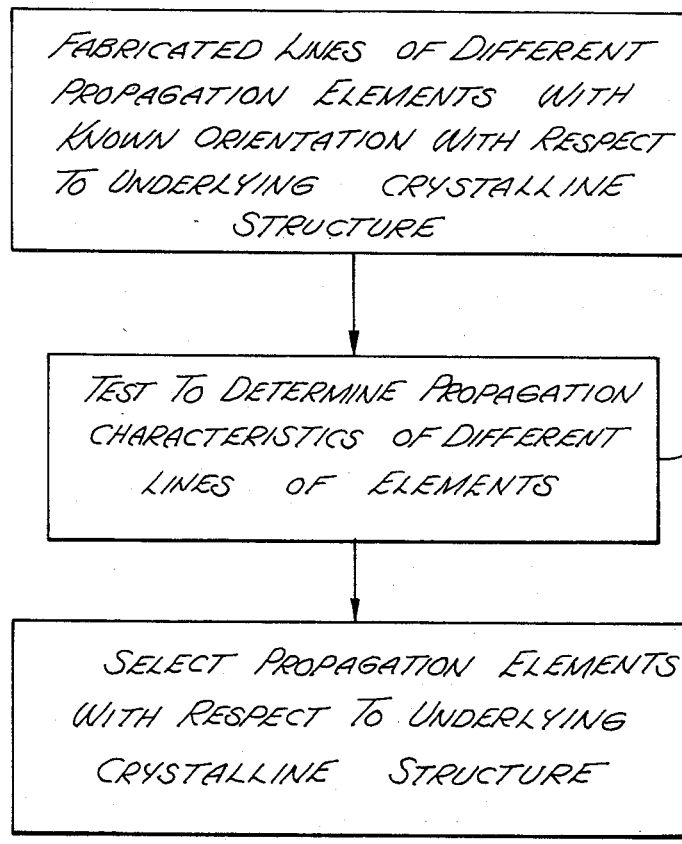
FIG. 2 is a series of blocks used to describe the invention method.

Referring to FIG. 2, the method of the present invention includes the step 20 of fabricating lines of different propagation elements with known orientation with respect to the underlying crystalline structure. For example, two differently shaped chevron propagation elements may be selected such as shown by the lines 51 and 52 of elements A and lines 50 and 53 of elements B in FIG. 4b.

In the presently preferred embodiment, two parallel lines of first propagation elements are fabricated, one line for propagating the bubbles in a first direction, and the other for propagating the bubbles in a second (opposite) direction (e.g., lines 51 and 52 for elements A of FIG. 4b). Two parallel lines of a second propagation element different than the first element are fabricated, again for propagating the bubbles in the first and second directions (e.g., lines 50 and 53 of elements B of FIG. 4b).

Bubbles are propagated along these lines in both directions to determine their propagation characteristics. The particular testing used in the presently preferred embodiment is discussed in conjunction with FIG. 4a. This testing is illustrated by step 21 of FIG. 2.

Next, based on the test results, one of the propagation elements is selected for propagating bubbles in the first direction, and the other for propagating bubbles in a second direction. This is shown by step 22 in FIG. 2.

Referring to FIG. 4b, assume that two different chevron elements have been selected for testing. (These are shown as elements "A" and "B" in FIG. 4b.) Line 52 of elements A is fabricated to propagate bubbles in a first direction indicated along the line of elements 52. Another line 51 of elements A is fabricated to propagate bubbles in a second direction opposite to the direction shown for line 52. For the second (different) propagation elements B, a line 53 of elements is fabricated to move bubbles in one direction as indicated along line 53 and a second line of elements B is fabricated to move bubbles in the opposite direction as indicated along line 50.

Now, the propagation characteristics for each of the elements is determined. In the presently preferred embodiment, this empirical determination is made at various fixed bias fields shown along the ordinate 55 and for different drive fields shown along the abscissa 56. For instance, for a given bias field 57, the drive field is raised until the minimum required drive field is determined for propagating the bubbles along a line of elements in a given direction. By way of example, for the line 50 of elements B, (in the direction indicated by the arrow along line 50) a drive field corresponding to 57a or greater is required, thus forming one point along the curve 500 of FIG. 4a. For the line of elements 51, the minimum drive field required for the bias field level of 57 is shown as point 57b along the curve 510. Similarly, for the line of elements 52, point 57d is shown along curve 520 and finally, for the line of elements 53, point 57c is illustrated along curve 530.

First compare the curves 500 and 530 of FIG. 4a. Both these curves represent the propagation characteristics for the elements B; however, where a bubble is propagated in opposite directions the curve 500 has a much larger "safe region". That is, a bubble may be propagated in one direction using elements B with a much lower drive field than in the opposite direction.

Similarly, comparing the curves 510 and 520, the curve 510 provides a much larger safe region when compared to curve 520. Thus, when the bubbles are propagated along elements A in the direction indicated along the line 51 of elements A, much better propagation occurs than when the bubbles are propagated along elements A in the direction indicated along the line 52.

As is apparent from FIG. 4a, the elements A should be selected when moving bubbles in the direction indicated along the line 51 of elements A. The elements B should be selected for moving bubbles in the direction indicated along the line 50 of elements B. In this manner, bubbles may be moved at a substantially lower drive field than would be required to propagate bubbles as indicated along lines 52 and 53.

Referring again to FIG. 3, a more complete determination of optimum propagation element and direction with respect to the underlying crystalline structure can be determined using orthogonal test patterns. Assume in FIG. 3 that two different chevron propagation elements are being tested; one is shown by a broken line such as lines 35, 36, 39 and 40, and the other by a continuous lines, lines 33, 34, 41 and 42. Once again, as was the case for the example of FIGS. 4a and b, the elements are placed in parallel line so that bubbles can be propagated in opposite directions. For instance, lines 35 and 36 allow the bubbles to be propagated with one type of element in the directions indicated by arrows 38. And, likewise, the lines of elements 33 and 34 allow testing of the other type of element in the directions indicated by arrows 38. However, unlike the example of FIGS. 4a and b, the two different lines of elements are also fabricated at right angles to the first lines so that bubbles can be propagated in the directions indicated by arrows 45. Lines 39 and 40 have the same elements as lines 35 and 36, and lines 41 and 42 have the same elements as lines 33 and 34.

The testing described in conjunction with FIG. 4b is performed for lines 33, 34, 35, 36, and for lines 39, 40, 41, and 42. By comparing the results, an optimum direction can be determined for each propagation element. (This direction most likely will not be precisely in the directions of arrows 38 or 45.) Then a final direction is selected which takes maximum possible advantage of each propagation element. This latter direction will be a compromise between, for instance, the optimum direction for each element.

Obviously, during the testing described in conjunction with FIG. 3, or for that matter, FIG. 4b, a plurality of different (more than 2) propagation elements may be simultaneously fabricated and tested. This allows selection from more than two elements. In addition, the placement of one row of elements relative to the row propagating in the opposite direction can be varied to further optimize the propagation in each direction, because this relative placement also effects the way each element row works.

Figure 5:
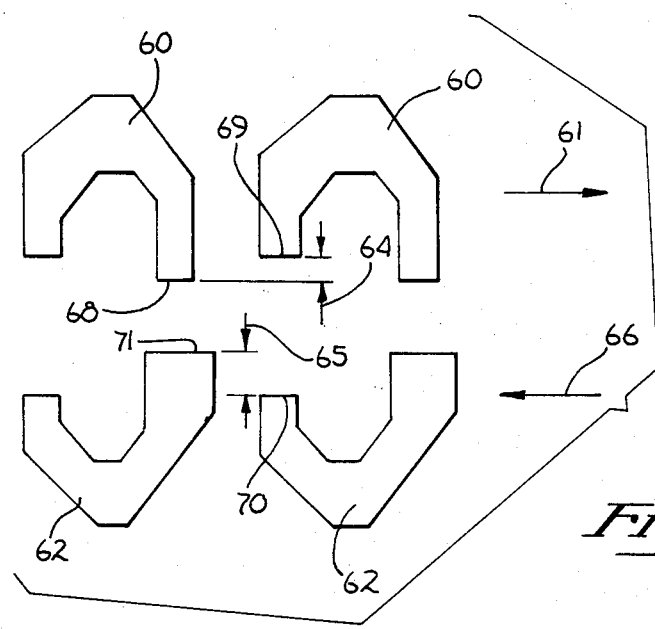
FIG. 5 is a plan view of propagation elements which are currently preferred.

Referring to FIG. 5 of the propagation elements 60, employing the above described method have been found ideal to propagate bubbles in the direction represented by arrow 61 and the propagation elements 62 have been found ideal for propagating bubbles in an opposite direction represented in arrow 66. As mentioned, the particular shape of the chevron-like patterns is very process dependent and the elements 60 and 62 may not be ideal for other processes. However, a common relationship between the propagation elements has been found to be helpful for propagating bubbles in both directions, and this relationship may be applicable to other processes.

Typically, in the prior art, a trailing edge of one element, such as edge 68 of elements 60 is in line with the leading edge 69 of the next element. Tests have shown that where the leading edge 69 is out of alignment as shown by dimension 64, better propagation is achieved. Likewise, when propagating in the direction indicated by arrows 66 with elements 62, the trailing edge 70 is out of alignment is indicated by dimensions 65 from the leading edge 71 of elements 62. The precise reason why this configuration is better is not known; however, it is believed that, as mentioned above, it is related to the stress which occurs in the permalloy members at the corners of these members.

Thus, a method has been described for determining optimum propagation elements in a magnetic bubble memory and their ideal direction relative to the crystal orientation of the substrate. The method enables operation of magnetic bubble memories at lower driving field intensities and thus, the power consumed by the memory is reduced.

I claim:

1. In a magnetic bubble memory which includes a layer in which magnetic bubbles are propagated and permalloy propagation elements for propagating said bubbles, a method for selecting propagation elements comprising the steps of:
   fabricating parallel lines of at least two different propagation elements;
   propagating magnetic bubbles in said layer for each of said lines of different elements to determine the propagation characteristics of each of said lines of different elements;
   selecting one of said lines of one of said elements for propagating bubbles in a first direction and one of said lines of the other of said elements for propagating bubbles in a second direction, based on said propagation characteristics so as to optimize bubble propagation in said layer;
   whereby bubble propagation in said layer is optimized.

2. In a magnetic bubble memory which includes an epitaxial layer in which magnetic bubbles are propagated and permalloy propagation elements for propagating said bubbles, a method for selecting propagation elements comprising the steps of:
   fabricating first and second lines of a first propagation element, said first line for propagating bubbles in a first direction and said second line for propagating bubbles in a second direction opposite to said first direction;
   fabricating third and fourth lines of a second propagation element, said third line for propagating bubbles in said first direction and fourth line for propagating bubbles in said second direction, said first elements having a different shape than said second elements;
   propagating magnetic bubbles in said layer in said first and second directions along said first, second, third and fourth lines to determine the propagation characteristics in said first and second direction for said first and second elements;
   selecting one of said first and second elements for propagating bubbles in said first direction and the other of said first and second elements for propagating bubbles in said second direction, said selection based on said propagation characteristics so as to optimize bubble propagation in said epitaxial layer;
   whereby bubble propagation is optimized in said memory.

3. The method defined by claim 2 wherein said epitaxial layer is ion implanted.

4. The method defined by claim 3 wherein said propagation characteristics are determined with respect to the crystal orientation of a substrate upon which said epitaxial layer is formed.

5. The method defined by claim 2 or 4 wherein said propagation characteristics are determined by observing magnetic bubble propagation at various bias fields and various rotating magnetic field strengths.

6. In a magnetic bubble memory which includes a layer in which magnetic bubbles are propagated and permalloy propagation elements for propagating said bubbles, an improvement comprising:
   first propagation elements for propagating magnetic bubbles in a first direction; and
   second propagation elements for propagating bubbles in a second direction opposite to said first direction;
   said first and second propagation elements being different in shape;
   whereby bubble propagation in said layer is optimized.

7. The bubble memory defined by claim 6 wherein said layer is an epitaxial layer.

8. The improvement defined by claim 7 wherein said epitaxial layer is ion implanted.

9. The improvement defined by claim 6 or 8 wherein the trailing edge of each of said first and second elements is misaligned from the leading edge of each of said first and second elements, respectively, relative to said propagation directions.

* * * * *